United States Patent [19]

Lau et al.

[11] Patent Number: 5,565,783
[45] Date of Patent: Oct. 15, 1996

[54] FAULT SENSOR DEVICE WITH RADIO TRANSCEIVER

[75] Inventors: Ken Lau, San Francisco; Jimmie Yee; Rodger Mayeda, both of Danville; Julian Riccomini, Pleasanton; Mary Ilyin, Walnut Creek, all of Calif.

[73] Assignee: Pacific Gas and Electric Company, San Francisco, Calif.

[21] Appl. No.: 510,505

[22] Filed: Aug. 2, 1995

Related U.S. Application Data

[62] Division of Ser. No. 314,958, Sep. 29, 1994.

[51] Int. Cl.$^6$ .......................... G01R 31/08; G08B 21/00
[52] U.S. Cl. .......................... 324/522; 324/127; 324/543; 340/870.17; 361/65
[58] Field of Search .......................... 324/519, 522, 324/537, 539, 543, 96, 115, 126, 127; 340/650, 651, 657, 662, 663, 664, 870.02, 870.17, 870.27; 361/63, 65, 79, 86, 87, 88, 94, 96

[56] References Cited

U.S. PATENT DOCUMENTS 4,758,962  7/1988  Fernandes .......................... 324/127 X
4,829,298  5/1989  Fernandes .......................... 340/870.27
5,006,846  4/1991  Granville et al. .................... 324/126 X
5,181,026  1/1993  Granville .............................. 324/96 X
5,432,438  7/1995  Baumgartner et al. ................ 324/127

*Primary Examiner*—Maura K. Regan
*Assistant Examiner*—Diep Do
*Attorney, Agent, or Firm*—Burns, Doane, Swecker & Mathis, LLP

[57] ABSTRACT

A method and a fault sensor device (1) which can detect and distinguish abnormal current and voltage events on an alternating current overhead and underground transmission line or distribution line (2). The fault sensor device (1) is contained in an elongated molded plastic housing (4). The fault sensor device (1) includes a current sensor (12) and a voltage sensor (14) connected in proximity to the transmission or distribution line (2) for monitoring current and voltage analog signals; an analog-to-digital converter (22) connected to the current and voltage sensors (12,14) for sampling the current and voltage analog signals and producing corresponding digital signals; a processor (11) responsive to the digital signals for detecting an abnormal condition and distinguishing whether any of a plurality of types of faults has occurred; and a transmitter (3) for transmitting the fault information from the processor (11) to a remote location.

23 Claims, 12 Drawing Sheets

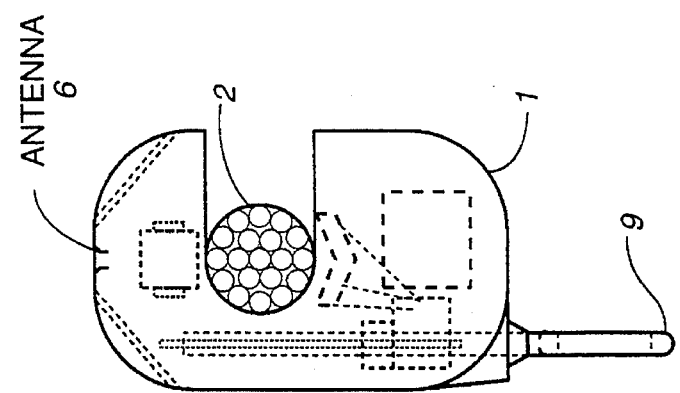
FIG._2
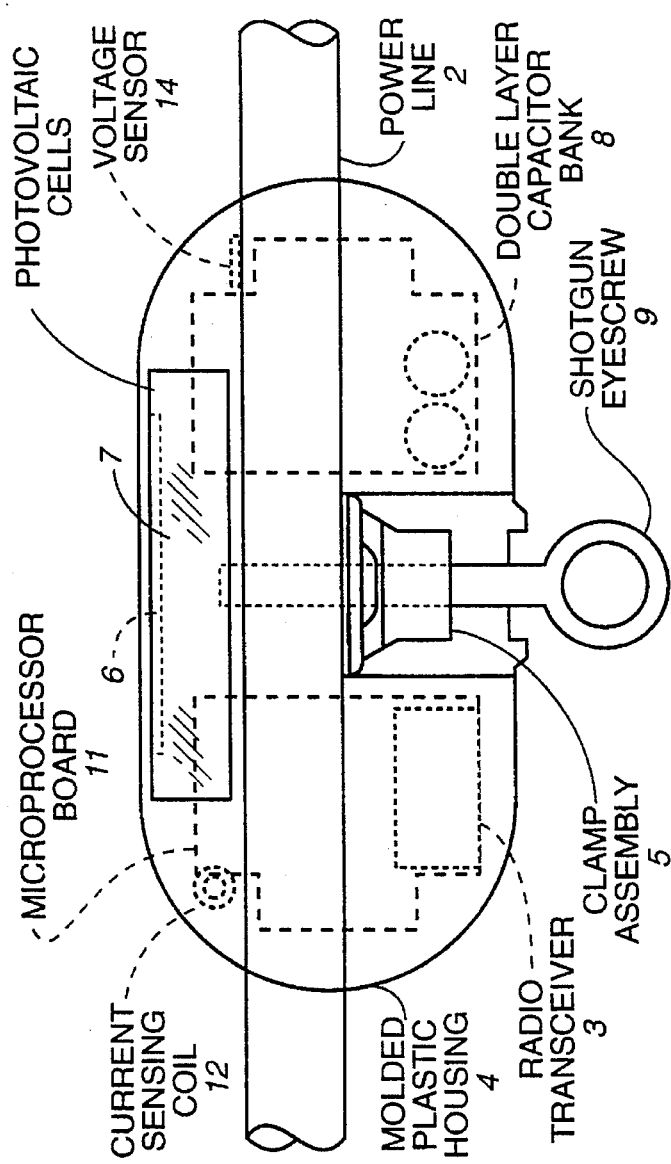
FIG._1

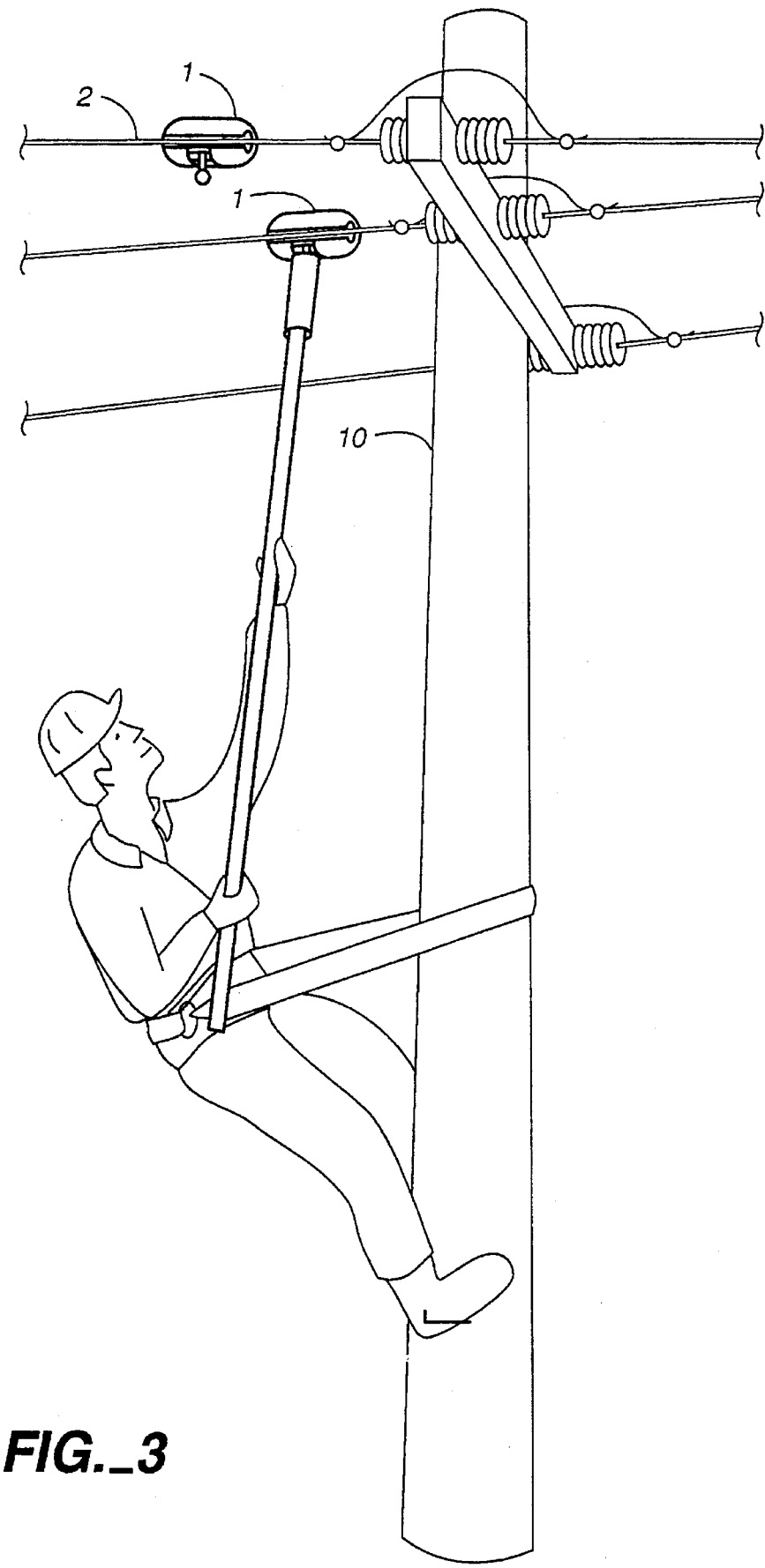
FIG._3

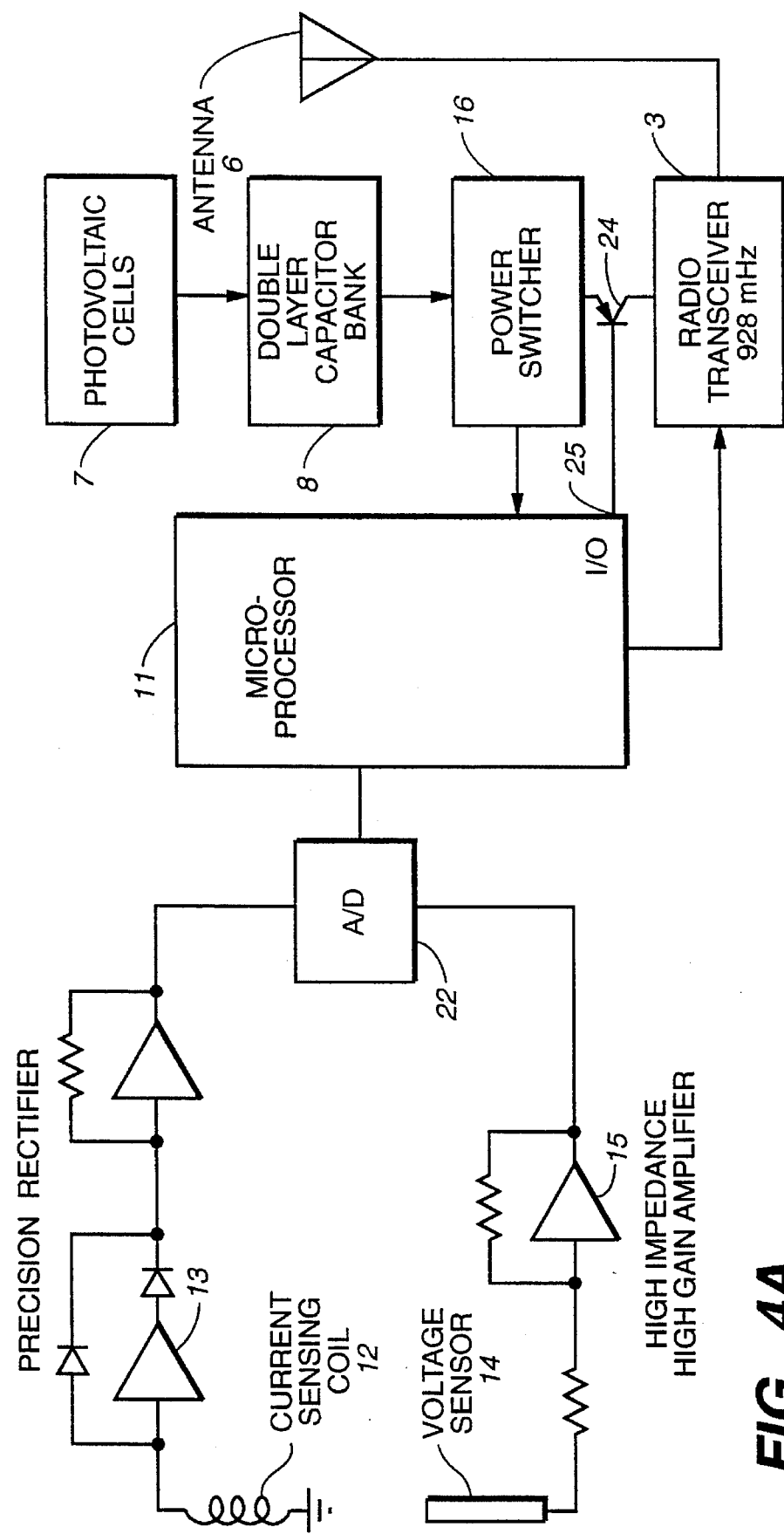
FIG._4A

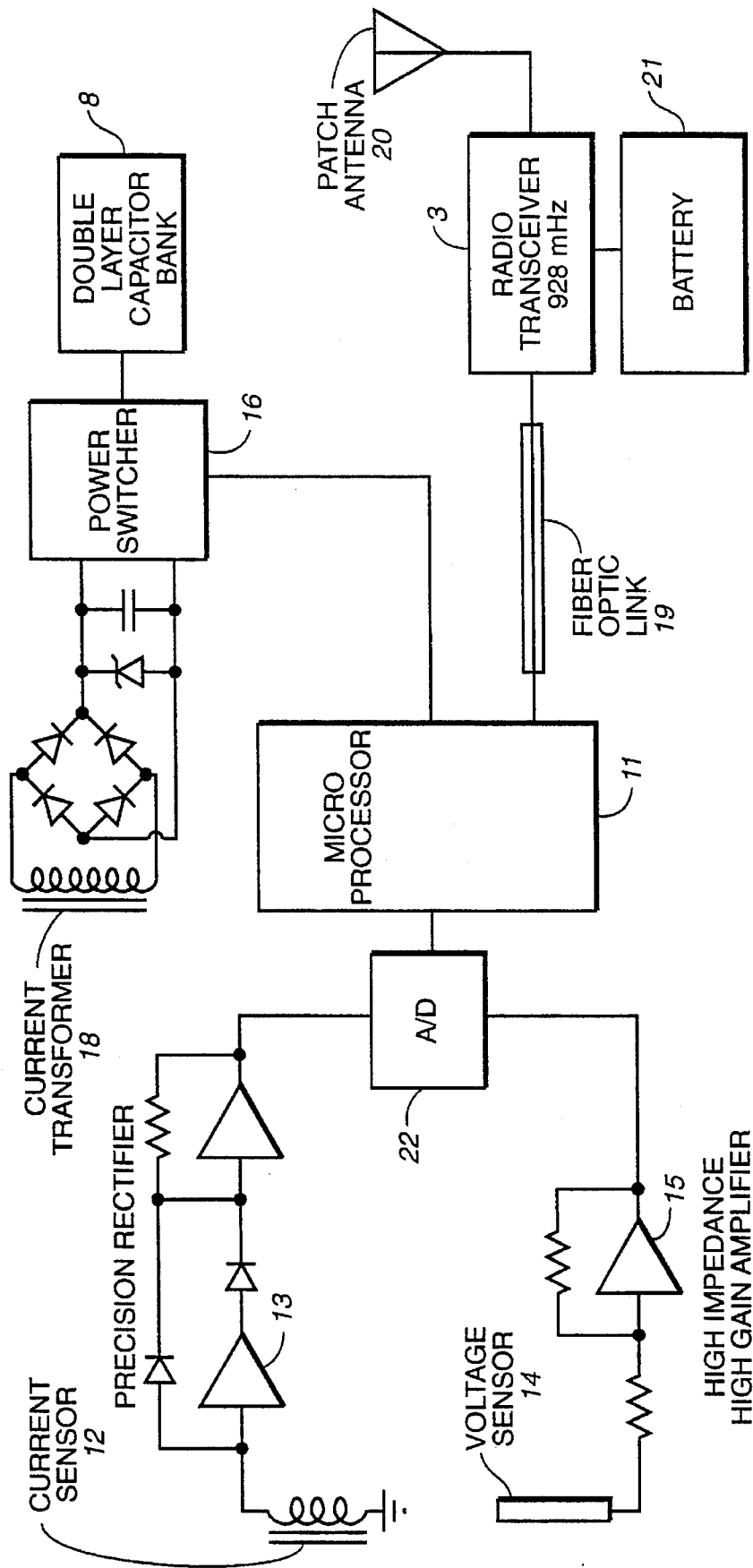
FIG._4B

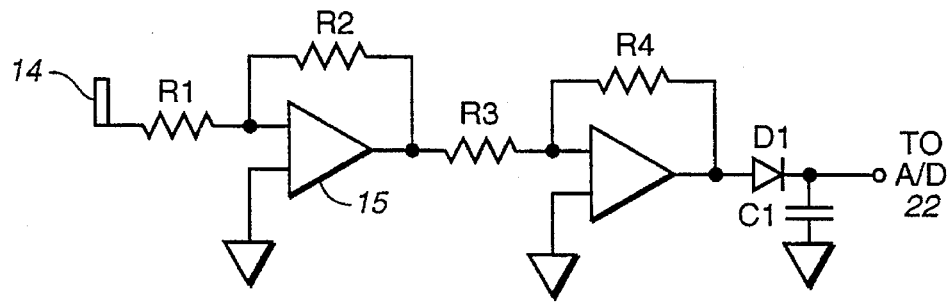
FIG._5A
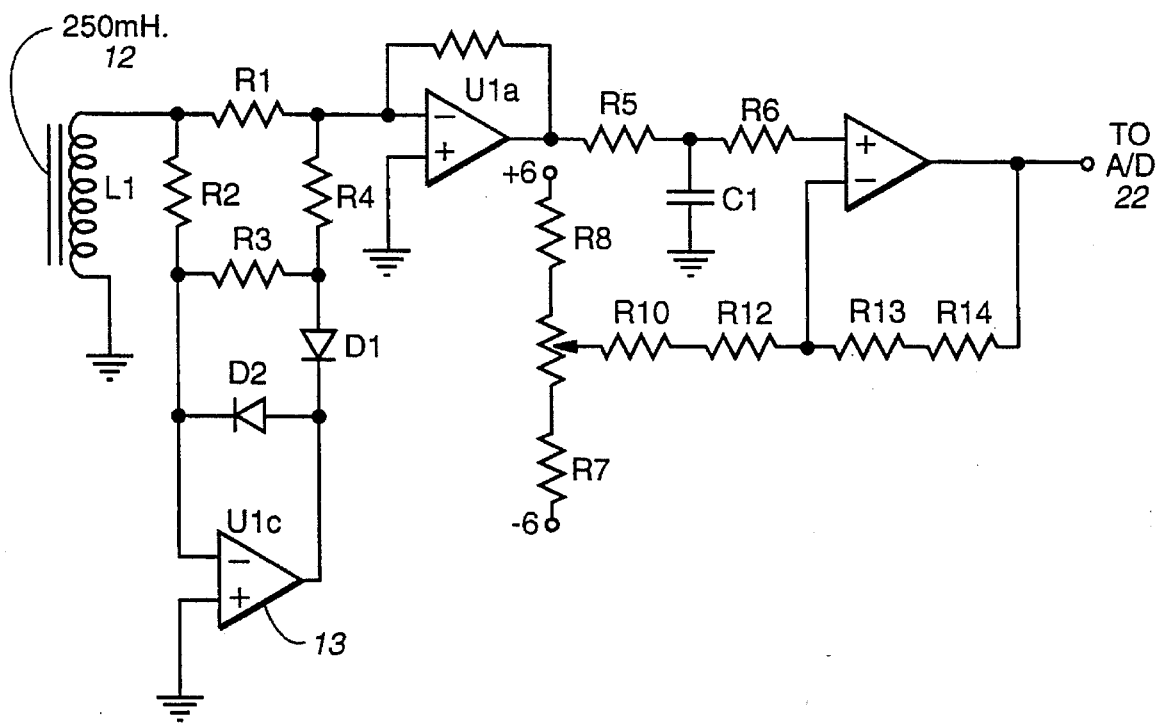
FIG._5B

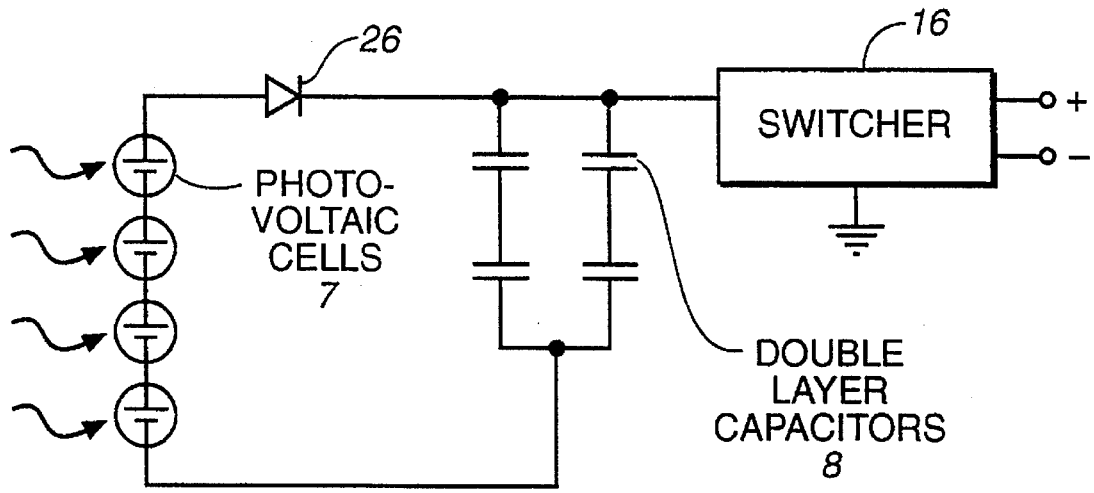
FIG._5C
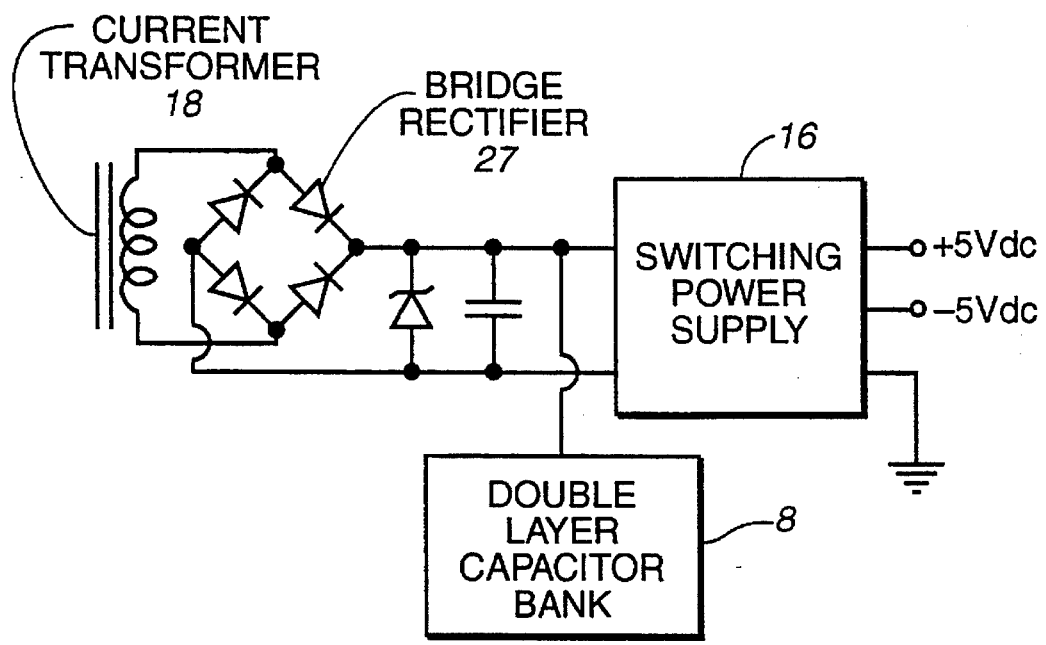
FIG._5D

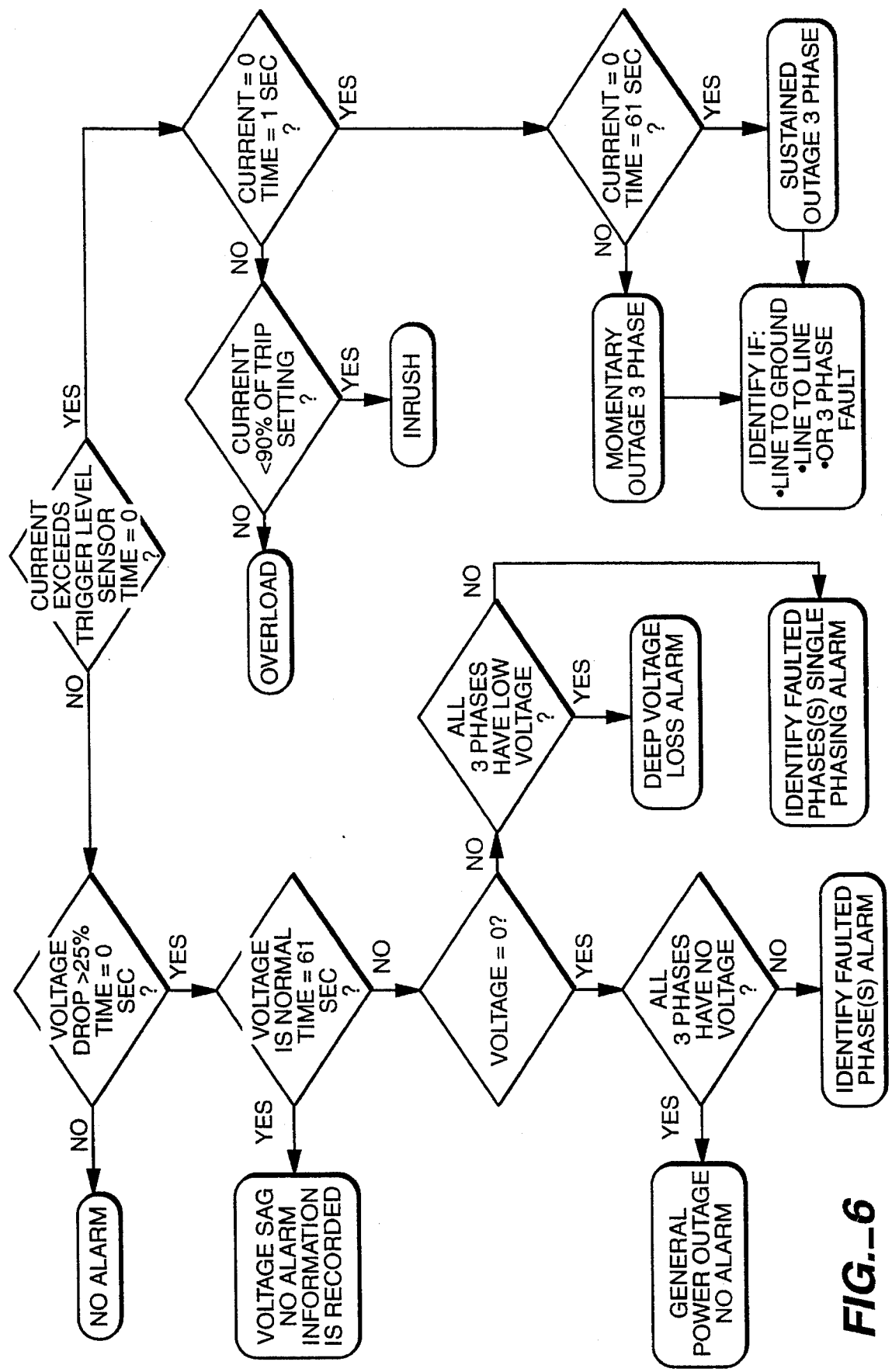
FIG._6

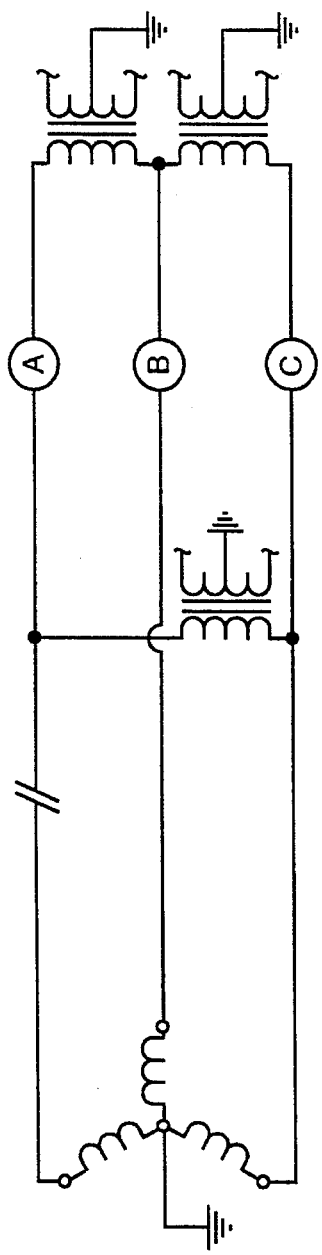
FIG._7A
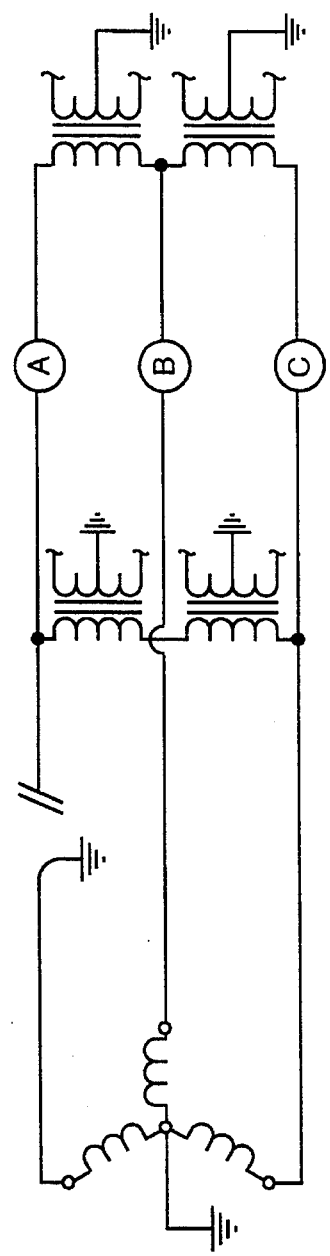
FIG._7B
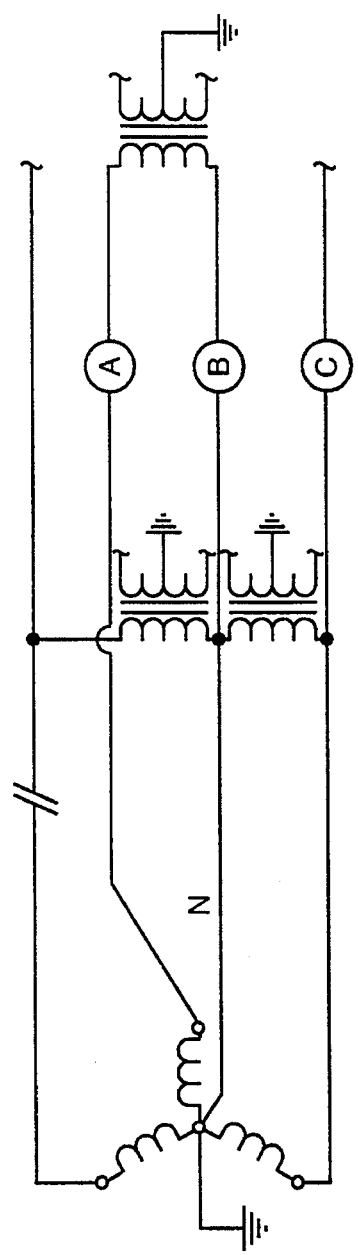
FIG._7C

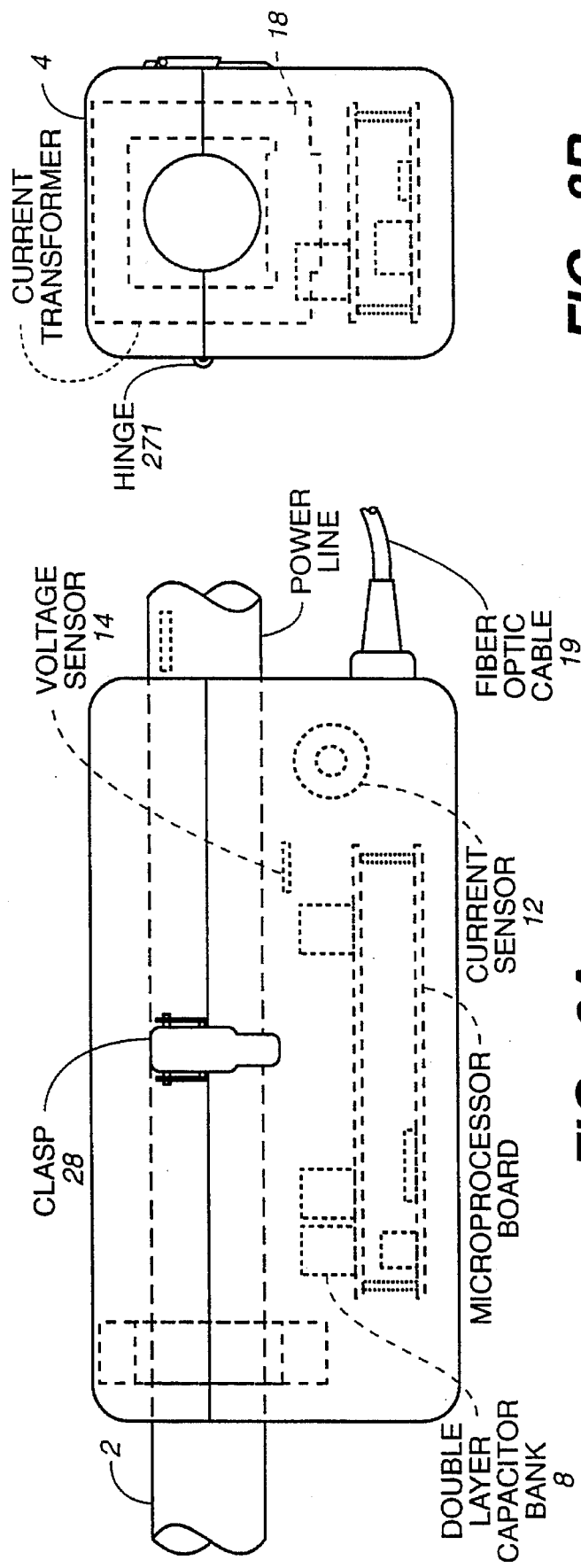

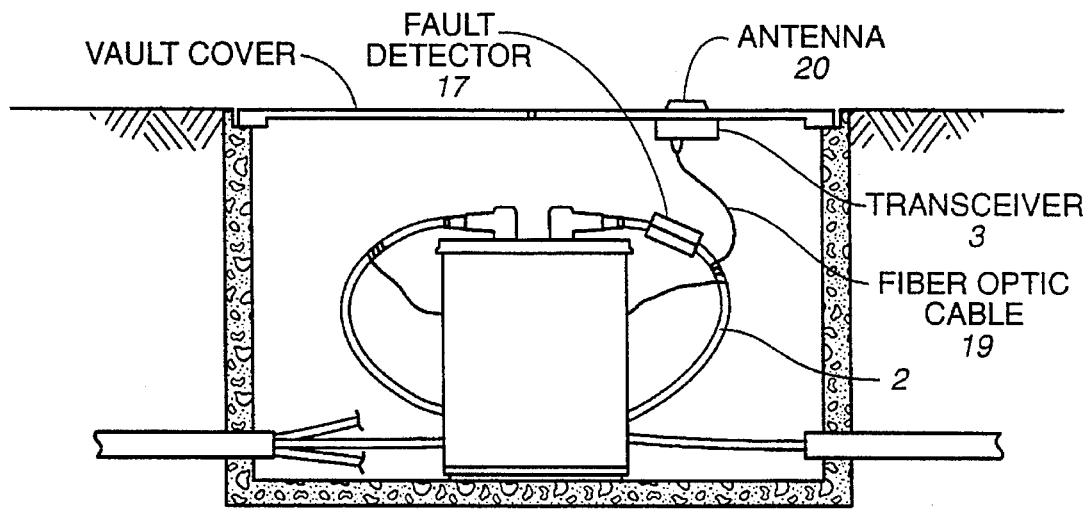
FIG._8C
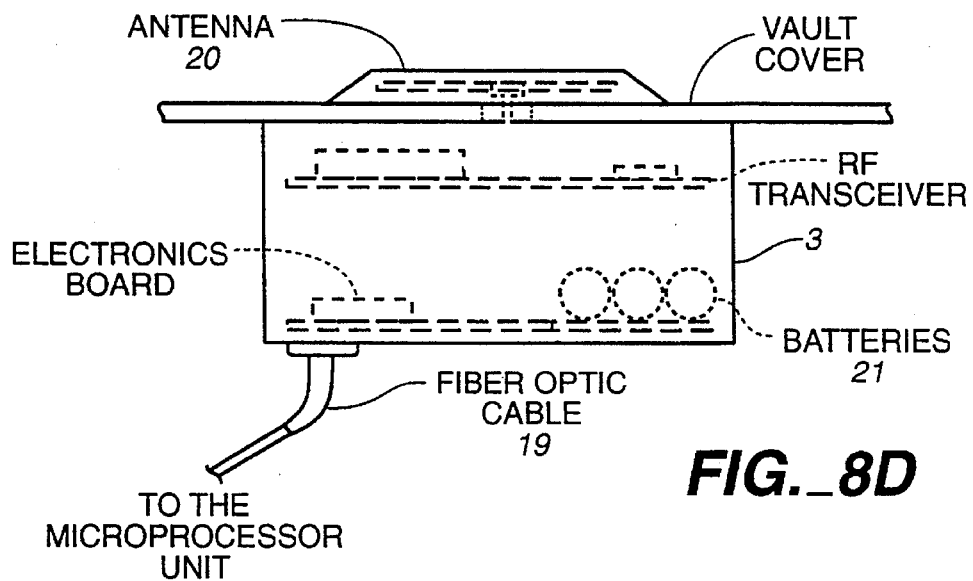
FIG._8D
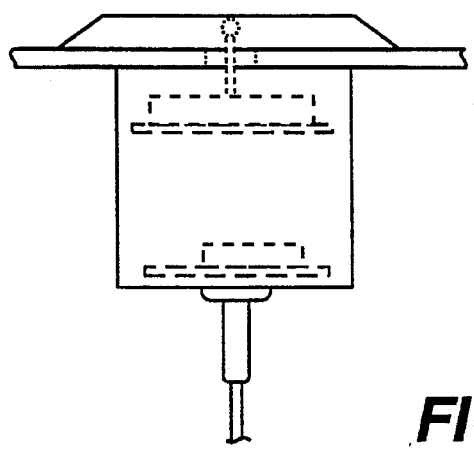
FIG._8E

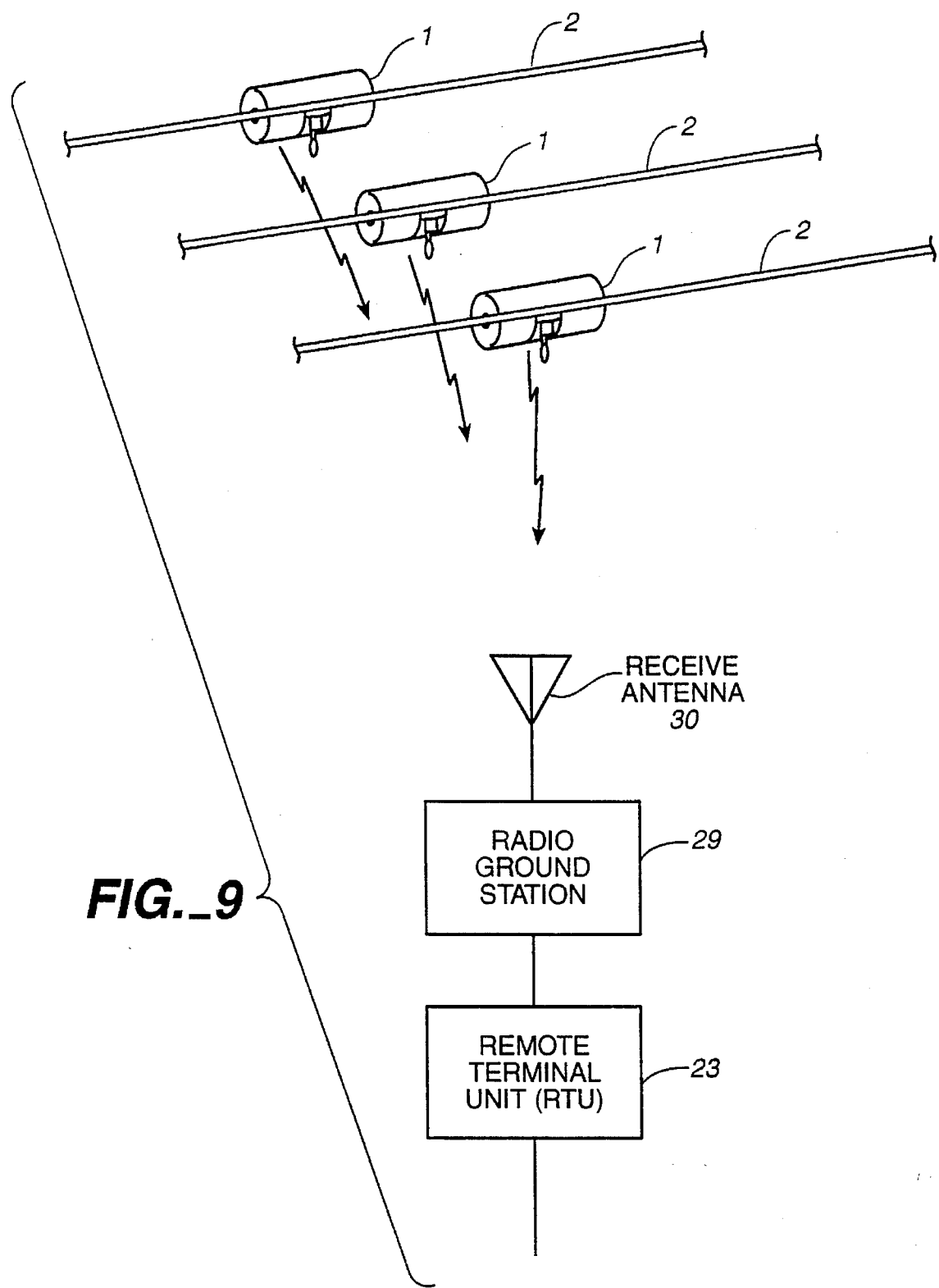
FIG._9

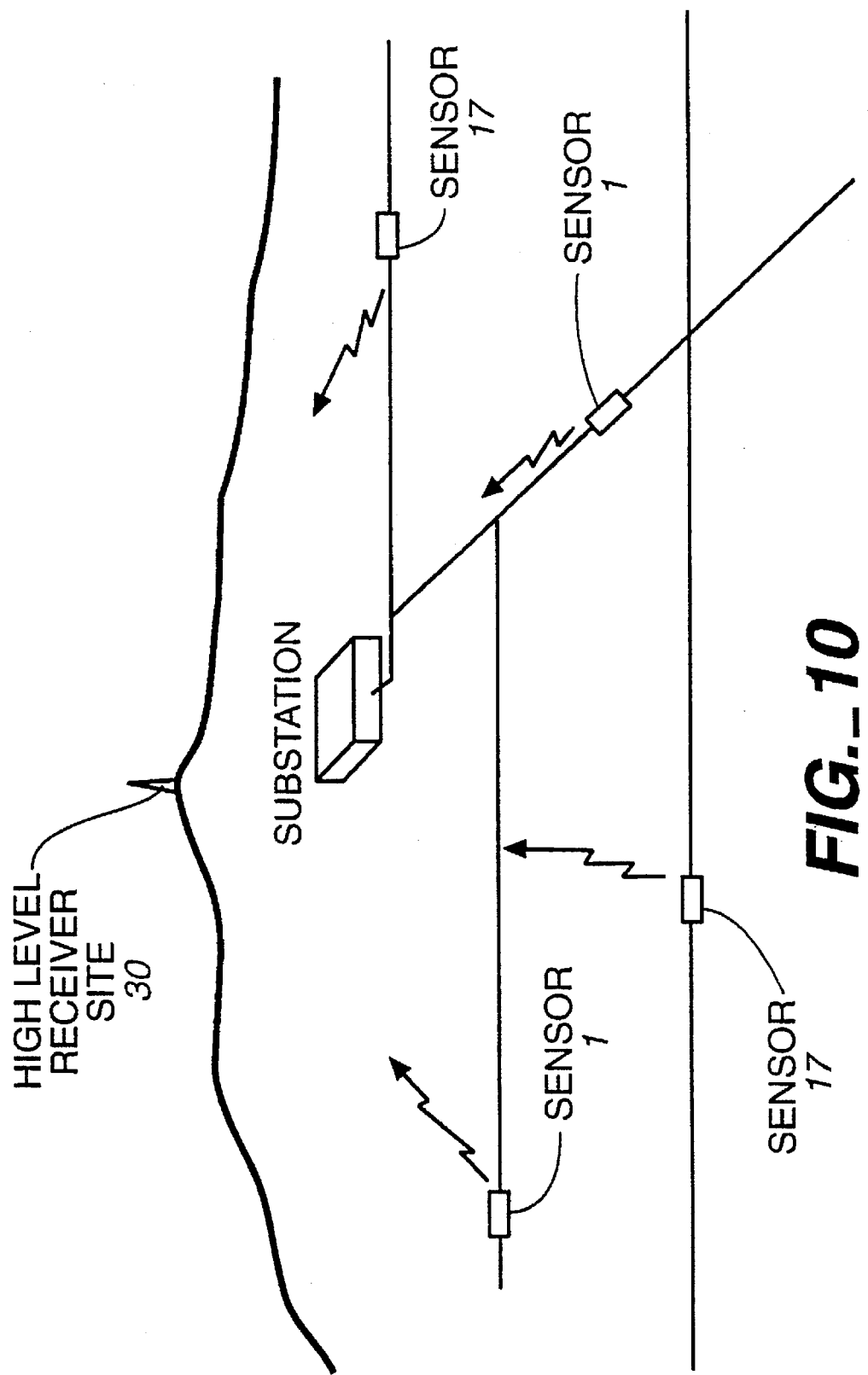
FIG._10

FAULT SENSOR DEVICE WITH RADIO TRANSCEIVER

This application is a divisional, of application Ser. No. 08/314,958, filed Sep. 29, 1994, pending.

BACKGROUND OF THE INVENTION

1. Field of the invention

The present invention relates to power transmission and distribution systems, more particularly to devices for detecting and transmitting current and voltage fault information from power transmission and distribution lines to a control center, switching center or other designated ground station.

2. State of the Art

In the field of power transmission and distribution, generating systems produce electrical power which is transmitted through a grid of electrical high voltage alternating-current (AC), three-phase power lines. Occasionally, a transmission or distribution power line experiences a fault in which, for example, a short circuit or equipment failure on a power line causes a circuit breaker to trip open, causing a power interruption to the customer. Other faults, in particular voltage faults, can occur when a power line falls onto a high impedance surface, such as dry grass or an asphalt road, but the wire remains energized because the short circuit current is not high enough to trip the circuit breaker. Another type of voltage fault occurs when there is an open circuit on one of the power lines in a three-wire, three-phase system, causing extremely low voltage to the customers located beyond the fault. Another type of voltage fault is an open wire on one of the power lines in a four-wire, three-phase system, causing loss of voltage potential on the open phase beyond the open point.

Current faults can occur on the power line, such as inrush current caused by the starting of large motors. Deep voltage sags can occur when there is a remote line failure. Early detection and characterization of these faults in an electrical power transmission and distribution system are essential to a quick resolution of the problem and to future planning of upgrades to the power transmission and distribution system.

Some fault events can lead to low-or-no voltage brown-outs or blackouts, while other faults create extremely hazardous conditions to the public. Other power line disturbances can cause problems to a customer who has very sensitive equipment that could be tripped off line by such disturbances as a voltage sag or a momentary interruption.

Prior art fault detectors have been developed in which various operating parameters of a power line are compared to present parameters to determine the character and amount of deviation. Some detectors have been used with event recorders in which analog representations of the parameters of interest are recorded and/or displayed.

Other prior art fault sensors or devices can only sense anti record abnormal current that causes a sustained outage. Most often the device needs to be manually reset at the device's location. In addition, these prior art devices are not provided with data transmission capability. To identity the power line section with a hull, each prior art device needs to be visually inspected, which often takes hours to complete and prolongs outage time for the affected customers.

Retaining sensor integrity over the file of the sensor is key to minimizing operation and maintenance cost. In the prior art, in order to monitor line current and voltage and transmit information relating to the faults occurring on a transmission or distribution line, batteries were needed to power a microprocessor and transmitter. The problem arises with such prior art devices that the batteries became exhausted over a period of time and require replacement or recharging. To manage such battery maintenance and/or replacement at thousands of remote sensing locations has involved considerable expense and has often resulted in a failure to detect faults over significant periods of time.

Other prior art devices mounted on an overheat, transmission or distribution line derive power by utilizing the energy stored in the magnetic field surrounding the operating conductor. At locations such as at the end of a distribution line, the load current may be at such a low Level that there is not enough energy to power the fault sensor. Such prior art devices utilize a magnetic iron collar surrounding the transmission or distribution line for extracting the magnetic field energy as shown in U.S. Pat. Nos. 4,635,055, 4,728,887 and 4,808,917. These collar devices are relatively bulky, expensive, heavy and difficult to install. Moreover, for satisfactory operation, it is necessary for the iron magnetic collar to be completely closed around the conductor without any gap, to provide flux continuity around the transmission line. This closed collar arrangement is necessary both in order to derive adequate power and also to isolate the measurement of current from the effect of other nearby conductors. Such closed iron core clamp devices am heavy and difficult to install, requiring special tools and in some cases two workers.

Another problem with the prior art fault sensors is that they are not remotely programmable. Thus, programming instructions and/or calibrations made prior to installation cannot be changed without retrieving or removing the device from the power line.

It is therefore one object of the present invention to provide a sensing device that can be attached to a transmission or distribution power line and which will sense and transmit at least one alarm condition using circuitry which is operated by power not dependent on power flowing in the overhead transmission or distribution power line.

Another object of the invention is to provide an overhead sensing device for a power line that can be attached to an overhead power line by a simple clamp on a shotgun hot stick, measure at least two power line operating characteristics, and transmit any fault information and/or alarm condition to a designated ground station using a transceiver powered by a bank of double-layer capacitors.

Another object of the invention is to provide an underground sensing device that can be clamped on me power line and that can measure at least two operating characteristics and then transmit any fault information and/or alarm condition to a designated ground station using a transceiver and a fiber optic link.

Another object of the invention is to provide a sensing device for an overhead power line that can be completely controlled or programmed by communication signals from the ground using a transceiver provided within the device.

Another object of the invention is to provide a compact, lightweight sensing device for an overhead power line that can be easily attached and removed from a power line and measure at least two of its operating characteristics.

Still another object of the invention is to provide a sensing device for a power line that can be attached to a power line for measuring at least two of its operating characteristics and that is particularly well adapted for economy of manufacture.

SUMMARY OF THE INVENTION

The aforesaid and other objects of the invention are accomplished by the sensing device of the present invention. The sensing device may be either an overhead or underground sensing device. The overhead sensing device is comprised of an elongated housing formed from extruded or otherwise processed plastic. Fixed to the housing is a clamp assembly having a jaw portion adapted to extend at least partially around the circumference of a power line and compatible with standard industry installation tools. The sensing device which can detect and distinguish between various types of faults on transmission and distribution lines, preferably including momentary outage, sustained outage, normal overload, inrush, an open line on one to three phases of the circuit with the possibility of a live line on the ground, and voltage sag. The device constantly monitors absolute current and relative voltage. A small current sensing coil is housed at a fixed distance from the power line and measures me magnetic field strength at that point, which is proportional to the power line current. When a current fault event is detected, the signal is sent through a precision rectifier and then on to a microprocessor situated within the housing. A small capacitively coupled voltage sensor is housed at a fixed distance from the power line. The type of power line and distance from the sensor to the power line are programmed into the microprocessor in order to measure relative voltage. In the event that the line voltage on the power line drops below a threshold voltage setting of the device, the voltage sensor is activated and fault information is sent through a high impedance high gain amplifier to a microprocessor situated within the housing. The signal is processed by the microprocessor, which distinguishes which type of voltage fault has occurred. Information concerning the type of voltage fault is transmitted by a transceiver connected to an antenna within the housing in the overhead sensor device.

In an underground sensor device, the antenna is located instead on an equipment vault and is connected to the sensor device by a fiber optic link. Signals from the sensor are transmitted via the antenna and received and processed by monitoring equipment at a remotely located ground station.

If the device has alarmed because of current fault conditions, then when normal current levels return the device can reset itself immediately or reset itself after a predetermined period of time, or to be reset remotely from an operating center or designated ground station. Similarly, if the device has alarmed because of voltage fault conditions, then when normal voltage levels return the device can reset itself immediately or reset itself after a predetermined period of time, or be reset remotely from a control center, switching center or any other designated ground station. Power for activating the sensor circuitry and for processing and transmitting related signals is furnished by a bank of double-layer capacitors (which having typical values greater man one farad). This bank is recharged by photovoltaic cells attached to the outer surface of the overhead sensor device or by a current transformer surrounding the underground power fine.

Central circuitry for the transceiver circuit includes a microprocessor which can be initially programmed to provide trigger and threshold levels. The microprocessor can also be controlled from the remote ground station to alter the operating program of the device if different levels are desired. A time delay for resetting the device can also be reprogrammed remotely.

With the information provided by the device, operators can respond to faults promptly and appropriately. For a sustained alarm, operators may choose to isolate the affected section and perform load switching to restore service to affected customers; for an overload alarm, operators may execute load transfers to relieve the overloaded line section; for a momentary outage alarm, operators may dispatch line patrolmen to identify the possible cause of the trouble, such as tree branches getting too close to the power line, and schedule a maintenance crew to correct the problem; for an inrush alarm or a voltage sag, operators may refer the problem to engineers, who may then devise remedial action to correct the deficiency; and for an open line on one to three phases with a possibility of a fallen live line on the ground, operators may identify the problem location and de-energize the affected line section by remote control switches, or dispatch line trouble-men to execute the switching.

BRIEF DESCRIPTION OF THE DRAWING

The present invention may be further understood from the following description in conjunction with the appended drawing. In the drawing:

FIG. 1 is a front elevational view of an overhead fault sensor, in accordance with one embodiment of the invention, mounted on a power line;

FIG. 2 is a view in end elevation of the overhead fault .sensor device of FIG. 1;

FIG. 3 is an illustration of the overhead fault sensor being mounted on a power line;

FIG. 4A is a block diagram of the principal components of the overhead fault sensor of FIG. 1;

FIG. 4B is a block diagram of the principal components of an underground fault sensor;

FIG. 5A is a schematic diagram of a voltage sensing means of the invention;

FIG. 5B is a schematic diagram of a current sensing means of the invention;

FIG. 5C is a schematic of a power supply and a rechargeable power backup system of the overhead fault sensor;

FIG. 5D is a schematic of a power supply and a rechargeable power back-up system of the underground fault sensor;

FIG. 6 is a flow chart illustrating a logic flow of the fault sensing device used to distinguish between various fault conditions;

FIG. 7A is an illustration of a three-wire system with a live, grounded line;

FIG. 7B is an illustration of a three-wire system with an open line condition and a possibility of a live wire on the ground;

FIG. 7C is an illustration of a four-wire system with an open line;

FIG. 8A is a front elevational view of an underground fault sensor, in accordance with another embodiment of the invention;

FIG. 8B is a view in end elevation of the overhead fault sensor device of FIG. 8A;

FIG. 8C is an illustration of the underground fault sensor in a vault;

FIG. 8D is a front elevational view of a transceiver portion of the underground fault sensor;

FIG. 8E is a view in end elevation of the transceiver portion of the underground fault sensor;

FIG. 9 is an illustration of the multiple fault sensors in remote communication with a ground station; and FIG. 10 is a block diagram of a fault sensor monitoring system in accordance with the present invention.

DETAILED DESCRIPTION OF THE PREFERRED EMBODIMENTS

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

With reference to the drawings, FIGS. 1 and FIG. 2 show an overhead fault sensor device 1 embodying principles of the present invention as the fault sensor device appears in a typical installation when attached to an overhead power line 2. When in use the device will detect occurrence of, distinguish and transmit information concerning an alarm condition. The device senses Line current and line voltage under microprocessor control in a manner later described in relation to FIG. 4A, FIG. 4B, FIG. 5A, FIG. 5B and FIG. 5C.

A sensor identification number is preprogrammed into the sensor. This identification number and alarm condition information are transmitted in real time by a radio transceiver 3 so that the data can be received, recorded and processed at a remote designated ground station such as a control center. The ground station may be equipped with suitable data receiving and storage equipment for monitoring a collection of sensor de:vices attached to different transmission and distribution power lines at various distances, as well as means for sending signals back to each sensor device for reprogramming it or otherwise controlling its operation. The remote ground station is also equipped with a microprocessor which processes the incoming data to identify the faulted phase and to determine the cause of a momentary and/or sustained outage from among the following types of faults: single-line-to-ground, line-to-line or three-phase. The ground station's microprocessor also can identify which phase is experiencing an open circuit or voltage sag. Furthermore, in the overload condition, the ground station's microprocessor points out if the overload occurred on one, two or all three of the phases.

In broad terms, the overhead sensor device, as shown in FIG. 1 and FIG. 2, is comprised of an elongated housing 4 within which is contained electronic circuitry required for its operation. The housing is made of molded or extruded plastic which is ultraviolet resistant, such as ABS plastic. A clamp assembly 5 is centrally located for holding the device firmly to an overhead power line 2. A dipole antenna 6 is located just under the surface of the housing for sending via IF radio signals data obtained by the sensors of the device concerning faults and power line characteristics and for receiving control or reprogramming signals sent back to the device from the remote ground monitoring and control station or other ground station. Power for operating the fault sensor is supplied by two panels of photovoltaic cells 7 attached to the outer surface of the housing and wired so as to charge a bank of double-layer capacitors 8 within the housing.

The clamp assembly 5 consists of the housing frame, a lower jaw and an eyescrew 9. As shown in FIG. 1, the lower jaw of the clamp assembly 5, preferably made of metal, moves as the eyescrew 9 is turned to clamp on to the overhead power line 2. Threads provided in the plastic housing for the eyescrew are also metal. The length of the screw and size of the lower jaw of the clamp assembly 5 allow gripping various diameters of overhead power lines. A lock washer allows the lower jaw of the clamp assembly 5 to remain firmly attached to the overhead power line 2.

As shown in FIG. 1 and FIG. 2, the equipment within the sensing device is primarily molded to the housing 4. A capacitively coupled voltage sensor 14 and a pickup current coil 12 are molded at a precise location in the housing 4. A microprocessor 11 is shielded by a metal foil and then molded into the housing 4. The transceiver 3 is also molded inside. The two panels of photovoltaic cells 7 are bonded to the housing 4. The clamp assembly 5 is molded into the housing 4.

As shown in FIG. 3, the fault sensor is mounted on an energized overhead power line easily and quickly by means of a so-called "hot stick" 10 manipulated by an individual on the ground, in a bucket truck, or from a power line pole. The hot stick 10 includes a "shotgun" internal attachment mechanism which attaches to the eyescrew 9 of the overhead fault sensor 1. To attach the overhead fault sensor 1, the hot stick 10 is attached first to the sensor. Then the sensor is mounted on the overhead power line 2 and the handle of the hot stick 10 is turned, thereby attaching the device to the overhead power line 2. When the overhead device 1 has been mounted, the shotgun internal attachment mechanism is deactivated and the hot stick 10 is detached from the device. Reinserting the hot stick and turning it in the opposite direction will open the clamp assembly 5 and allow the overhead fault sensor 1 to be removed from the overhead transmission or distribution power line 2. This attachment and removal feature provides flexibility and efficiency in placing the fault sensors in the transmission and distribution system.

Referring to FIG. 4A, a block diagram for the overhead fault sensor is shown. The current sensing coil 12 is continuously monitored by the microprocessor 11 through a precision rectifier circuit 13. The microprocessor 11 is programmed to follow a logic flow chart to be described in relation to FIG. 6. Additionally the voltage sensor 14 is continuously monitored by the microprocessor 11 through a high impedance, high gain amplifier circuit 15. A power switcher 16 takes the voltage from the bank of double-layer capacitors 8 and regulates it to a set voltage for the microprocessor 11 and to a prescribed voltage range for the analog circuitry. The double-layer capacitor banks 8 are charged by photovoltaic cells 7. When the type of fault is distinguished, then the radio transceiver 3 sends the sensor identification number and event information to a load center or any other designated ground station via the antenna 6.

Referring to FIG. 4B, a block diagram for the underground fault sensor 17 is shown. The current sensing coil 12 is continuously monitored by the microprocessor 11 through a precision rectifier circuit 13. The microprocessor 11 is programmed to follow a logic flow chart to be described in relation to FIG. 6. Additionally the voltage sensor 14 is continuously monitored by the microprocessor 11 through a high impedance high gain amplifier circuit 15.The power switcher 16 takes the voltage from the bank of double-layer capacitors 8 and regulates it to five volts for the microprocessor 11. The double-layer capacitor bank 8 is powered by a current transformer 18 which is clamped around the underground power line 2. When the type of fault is distinguished, then the microprocessor 11 sends the sensor identification number and event information through a fiber optic link 19 to a transceiver 3 which has a patch antenna 20. The radio transceiver 3 is powered by a battery 21. The signal is then sent to a load center or any other designated ground station.

With reference to FIG. 4A. FIG. 4B, FIG. 5A and FIG. 5B of the drawing, the fault sensor device's electronics include a microprocessor 11, RAM, I/O circuitry, timer components, a high gain and high impedance amplifier 15, an A/D converter 22, capacitors, and a precision rectifier 13. Sampled values of the monitored parameters are digitized by the A/D converter 22, stored in RAM, processed by the microprocessor 11 in accordance with instructions stored within an EEPROM board, and then sent over an eight-byte databus to a parallel spread-spectrum transceiver 3. The ground station at a designated location includes a microprocessor (similar to microprocessor 11) to which signals received from the devices are supplied for further processing, such as determining where the fault has occurred. Then the data am communicated to a central data receiving and control facility by a data link schematically indicated in FIG. 9, such as a Supervisory Control and Data Acquisition (SCADA) remote terminal unit (RTU) link 23 or radio. This aspect of the invention is described in greater detail below.

With reference to FIG. 5A, the capacitively coupled voltage sensor 14 and the power line size, programmed into the microprocessor 11, are used by the microprocessor to measure the relative line voltage. The capacitively coupled voltage sensor 14 is located at a fixed distance from the power line. The voltage field is picked up by the voltage sensor 14 and is sent through a high gain and high impedance amplifier 15 into the A/D converter 22. The digitized signal is then sent to the microprocessor 11 for processing, and then the final information is sent on to the transceiver 3.

With reference to FIG. 5B, current flow through the power line is measured by a current sensing pickup coil 12 which is located at a fixed distance from the power line. A current is induced in the coil 12 by the magnetic fields of the power line 2. The pickup coil 12 feeds a voltage into an precision rectifier 13. The analog signal is fed into the A/D converter 22. The digitized signal is then sent to the microprocessor 11 for processing, and then the final information is sent on to the transceiver 3.

With reference to FIG. 5C and FIG. 4A, power to operate the overhead sensing device electronics and transceiver is derived from a bank of double-layer capacitors 8. The bank of double-layer capacitors 8 is charged by two panels of photovoltaic cells 7 mounted on the housing surface 4 of the overhead fault sensing device. The photovoltaic cell panels 7 are connected through a blocking diode 26. Each panel may consist of 21 cells in a series configuration, each cell being rated at 25 mA at 0.5 V for total voltage of 10.5 volts. Such cells measuring 0.5×2.0 cm are commercially available. The photovoltaic cells 7 are connected to the bank of double-layer capacitors 8. The bank of double-layer capacitors 8 is connected to the power switcher 16. Another lead to the power switcher 16 connects to the microprocessor 11 and electronics.

Two leads, one from the precision rectifier 13 of the current sensor 12 and one from the high impedance high gain amplifier 15 of the voltage sensor 14, connect to the A/D converter 22 on the microprocessor 11 (FIG. 4A). Both of these leads have a prescribed voltage signal range. From the power switcher 16 there are two leads. One is a lead through a transistor 24 which is switched off in the sleep mode until a fault condition has occurred or when there is a system functionality check. This lead is connected to both the radio transceiver 3 and an I/O port 25 of the microprocessor 11 through the transistor 24. The second lead provides power to the microprocessor 11.

Referring to FIG. 5D and FIG. 4B, power to operate the underground fault sensor 17 is derived from the bank of double-layer capacitors 8. The bank of double-layer capacitors 8 is charged by inductive power from current through the underground power line 2. When there is minimal underground power line current then the bank of double-layer capacitors 8 is used. A hinged current transformer 18 with the power line 2 forming the single turn primarily supplies all internal power to the underground fault sensing device 17. Current in the power line 2 induces voltage and current in the windings of the current transformer 18 which is rectified by a bridge rectifier 27 as further described in U.S. Pat. No. 4,886,980, incorporated herein by reference. The hinged current transformer 18 is connected to the bank of double-layer capacitors 8. The bank of double-layer capacitors 8 is connected to the power switcher 16. Another lead to the power switcher 16 goes to the microprocessor 11 and electronics. Two leads, one from the precision rectifier 13 of the current sensor 12 and one from the high impedance high gain amplifier 15 of the voltage sensor 14, connect to the A/D converter 22 on the microprocessor 11. Both of these leads have a prescribed voltage range. From the power switcher 16 there is one lead which provides power to the microprocessor 11. The fiber optic link 19 from the microprocessor 11 is switched off in the sleep mode until a fault condition has occurred or when there is a system functionality check. This fiber optic link 19 is connected to the radio transceiver 3, which has a wakeup circuit. The radio transceiver 3 is powered by a battery 21.

Operation of the fault sensor when attached to a power line 2 being monitored in a typical installation may be described, relative to FIG. 4A and FIG. 4B, as follows.

The device is designed to activate the transceiver 3 when a fault occurs on the power line 2. During "sleep mode," power is applied constantly to most of the circuit elements that am unswitched, and when a power-up signal is generated, other elements of the circuit (in particular the transceiver 3) are switched to an "on" condition. The transceiver 3 is also powered up at timed intervals to check the status and operability of the fault sensor device. During this time, reprogramming signals can be sent to the device from a controller, switching center or a ground station at a designated location. In the underground fault sensor 17 the signals are sent to and from the microprocessor 11 through a fiber optic cable to and from the transceiver 3, which has a patch antenna 20 located on a vault (shown in greater detail in FIG. 8A and FIG. 8C.)

Referring to FIG. 6, the fault sensor activates when the current sensor 12 detects the monitored line current exceeding the trigger or threshold current settings at time=0. The current sensor 12 waits for a second (time=1 second) to check whether the current goes to zero. If the current has gone to zero, then the monitored line has experienced an interruption or outage. The current sensor 12 waits for another 60 seconds (time=61 seconds) to check whether the current remains zero. If the current remains at zero, then the power line has experienced a sustained outage. If the current does not remain at zero, then the line has experienced a momentary interruption.

If only one phase senses the excessive current, the fault is a line-to-ground fault. If the sensors on two of the phases sense the high current, the fault is a line-to-line fault. If the sensors on all three phases sense the high current, the fault is a three-phase fault. This detective scheme is based on the operation of protective devices on power lines. When a protective device detects a fault condition on the power line, the protective device opens to de-energize the power line within one second and then typically recloses in 5 seconds to test the line to see if fault current condition still persists. This test is done to prevent unnecessary prolonged outages caused by events such as tree branches momentarily coming in contact with the power line. If the circuit test is successful, the circuit is reset back to normal. If the fault current condition persists, then the protective device will open to de-energize the line again. Typically, protective devices will test the circuit three times within a 30 second period. At the end of this period, if the fault current condition persists, the device will lock open to de-energize the circuit until the affected section is isolated.

Therefore, at time=1 second, if the line current does not go to zero, the power line has not experienced any interruption. At time=61 seconds, if the line current is less than 90% of the threshold setting of the current sensor, the power line has experienced an inrush current probably caused by the starting of a large motor. But at time=61 seconds, if the line current is greater than 90% of the threshold settings, the line is most likely overloaded.

If the current sensor 12 does not detect excessive current but the voltage sensor 14 detects the monitored line voltage dropping below the threshold voltage settings at time=0, then a fault condition might exist. If the voltage drop is at least 25% below the nominal voltage and the low voltage persists at time=60 seconds, but only one or two phases sense the low voltage, then the power line is judged to be an open line with the possibility of a live line on the ground. An alarm is transmitted and identifies the faulted phase. If all three phases sense the persistently low voltage and the voltage is greater than zero, then the fault is a deep voltage drop, and an alarm is transmitted. If a zero voltage is sensed on all three phases, then the fault is a normal power outage and no alarm is transmitted.

If only one phase senses the loss of voltage, then the power line has an open line fault as illustrated in FIG. 7A. If there is a loss of voltage on one of the lines but there is still some current, then there is a possibility of an energized line on the ground where impedance is high as shown in FIG. 7B. In the three-wire, three-phase system of FIG. 7B, sensor A detects a voltage drop of at least 25%, indicating an open circuit scenario with the possibility of a live wire on the ground. In a four-wire system, if one sensor detects no voltage and the other two sensors have normal voltage, then this condition also indicates an open line situation as shown in FIG. 7C. In the four-wire, three-phase system of FIG. 7C, sensor A will detect zero voltage and sensors B and C will detect normal voltage.

If at time=1 second the sensor detects a voltage drop of at least 25% but this condition does not persist at time=61 seconds, then the power line has experienced a momentary deep voltage sag. The sensor will transmit this information for record keeping, but the signal transmission is not of an alarm grade.

With reference to FIG. 8A and FIG. 8B, the underground fault sensor device 17 is capable of sensing the values of various parameters with respect to the power line 2 upon which the sensor device is mounted. The current and voltage sensors previously described in relation to FIG. 5A and FIG. 5B are incorporated in the underground fault sensor device 17. The power system of the underground fault sensor device, with its current transformer 18 and bank of double-layer capacitors 8, has been previously described in relation to FIG. 5D.

In broad terms, the underground sensor device 17 is comprised of an elongated housing 4 within which am contained elements of an electronic circuit required for its operation. The housing 4 is made of molded or extruded plastic. The elongated housing is shaped like a "clam" with a hinge 271 and a clasp 28 which clamps onto the power line 2. As illustrated in FIG. 8C, a fiber optic cable 19 is connected to the transceiver 3, which has a patch antenna 20. As further shown in FIG. 8D and FIG. 8E, the transceiver 3 is mounted on the vault cover with the patch antenna 20.

With reference to FIG. 9 and FIG. 10, the overhead and underground fault sensor devices 1 and 17 are capable of both receiving and transmitting signals, as well as sensing the values of various parameters associated with the respective power line 2 upon which the sensor device is mounted. Although other types of communications links may be utilized, the invention is described herein as comprising of RF transmitting and receiving means in each of the fault sensors and in a ground station at a designated location 29. A ground station communication equipment antenna 30 is used to transmit and receive information. All fault sensors transmit dam on a single frequency channel for reception by the ground station antenna 30. Signals from the ground station antenna 30 are transmitted on a second channel for reception by the fault sensor transceiver 3 in a manner similar to that described in U.S. Pat. No. 4,855,671, incorporated herein by reference.

Each of the devices is equipped to measure the absolute value of current and relative value of voltage may, if desired, be further equipped to measure other parameters. When a fault occurs on a particular power line 2 which may have several sensing devices, several signals will be sent to provide the alarm information. In order to reduce the probability of data collision, each sensing device is programmed individually to stagger the alarm report. The staggered transmission algorithm is based on the sensing device's identification.

FIG. 9 illustrates how the sensors interact with the load center or any designated ground station 29. It is realistic to expect that up to a hundred sensor devices can communicate with one ground station 29 at a designated location. As illustrated in FIG. 10, at the designated location there is an antenna 30 with either a transceiver or a SCADA RTU 23 which receives the information from the devices. The information it receives includes the sensor identification, alarm condition and possibly the waveforms prior, during and after a voltage fault. The ground station 29 will also receive a sensor device status report on a predetermined regular schedule from each sensor device as to the device's functionality. During this reporting interval, the sensor device can also be reprogrammed. It will be appreciated by those of ordinary skill in the an that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A line-mounted fault sensor for monitoring at least two operating parameters of an AC power transmission or distribution line and deriving information concerning faults occurring on the line, comprising:

first and second sensors, connectable in proximity to the transmission or distribution line, for providing at least two analog signals each representative of a time varying value of one of said at least two operating parameters;

an analog-to-digital converter connected to said first and second sensors for sampling said at least two analog signals and producing corresponding digital signals;

a processor responsive to said digital signals for detecting an abnormal condition and thereafter distinguishing whether any of a plurality of types of faults has occurred, and if so which of the plurality of types of faults occurred; and a transmitter responsive to said processor for, if any of the plurality of types of faults occurred, transmitting to a remote location information identifying which of the plurality of types of faults occurred.

2. The apparatus of claim 1, wherein the plurality of types of faults include at least two of the following: momentary outage, sustained outage, normal overload, inrush, open line on one of three phases with a possibility of a fallen live wire, and voltage sag.

3. The apparatus of claim 1, wherein the plurality of types of faults include three or more of the following: momentary outage, sustained outage, normal overload, inrush, open line on one of three phases with a possibility of a fallen live wire, and voltage sag.

4. The apparatus of claim 1, wherein the transmitter transmits the information to a defined ground station location.

5. The apparatus of claim 4, wherein the defined ground station location is one of a switching center and a load center.

6. The apparatus of claim 1, further comprising:

a receiver responsive to signals transmitted from the remote location and operatively connected to the processor for reprogramming the processor.

7. The apparatus of claim 6, wherein the receiver is responsive to signals transmitted from the remote location for causing the processor to reset the fault sensor.

8. The apparatus of claim 6, further comprising:

a rechargeable energy storage device;

means for producing an electric current; and a power control circuit connected to the rechargeable energy storage device, said means for producing an electric current, and said processor.

9. The apparatus of claim 8, wherein the power control circuit derives regulated power from one of the rechargeable energy storage device and said means for producing an electric current, and delivers said regulated power to said processor.

10. The apparatus of claim 9, wherein the power control circuit charges the rechargeable energy storage device using current from said means for producing an electric current.

11. The apparatus of claim 8, wherein the rechargeable energy storage device is a bank of capacitors.

12. The apparatus of claim 11, wherein the capacitors are double-layer capacitors.

13. The apparatus of claim 8, wherein the means for producing an electric current comprises an array of photovoltaic cells.

14. The apparatus of claim 8, wherein the means for producing an electric current comprises a coil inductively coupled to the AC power transmission or distribution line.

15. The apparatus of claim 8, wherein said power control circuit is connected to said transmitter and said receiver through a switch controlled by said processor.

16. The apparatus of claim 15, wherein said transmitter and receiver are programmed to remain in a sleep mode except after the occurrence of a fault and during periodic check intervals, when the processor controls said switch to supply power to said transmitter and said receiver.

17. The apparatus of claim 1, wherein said first sensor is a voltage sensor arranged so as to radially oppose the AC power transmission or distribution line only within a sector, from a center of the AC power transmission or distribution line, of less than 180°.

18. The apparatus of claim 17, wherein said voltage sensor has a central axis located substantially in a plane parallel to the AC power transmission or distribution line.

19. The apparatus of claim 18, wherein the voltage sensor is capacitively coupled to the AC power transmission or distribution line.

20. The apparatus of claim 19, wherein the voltage sensor is located at a fixed predetermined distance from the AC power transmission or distribution line, and a size of the AC power transmission or distribution line is programmed into said processor.

21. The apparatus of claim 1, wherein said first sensor is a voltage sensor and said second sensor is a current sensor, each of the voltage sensor and the current sensor being arranged so as to radially oppose the AC power transmission or distribution line only within a sector, from a center of the AC power transmission or distribution line, of less than 180°.

22. The apparatus of claim 21, wherein the voltage sensor and the current sensor each have a central axis located substantially in a plane parallel to the AC power transmission or distribution line.

23. The apparatus of claim 1, adapter for use with an underground AC power transmission or distribution line, the apparatus further comprising:

a patch antenna connected to said transmitter; and a fiber optic link connecting said transmitter and said processor.

* * * * *